United States Patent [19]
Akata

[11] Patent Number: 5,223,833
[45] Date of Patent: Jun. 29, 1993

[54] SERIAL-PARALLEL CONVERTING CIRCUIT
[75] Inventor: Masao Akata, Tokyo, Japan
[73] Assignee: NEC Corporation, Tokyo, Japan
[21] Appl. No.: 770,039
[22] Filed: Oct. 2, 1991
[30] Foreign Application Priority Data
   Oct. 2, 1990 [JP] Japan .................................. 2-264167
[51] Int. Cl.⁵ ....................... H03M 7/00; H03K 21/00
[52] U.S. Cl. ....................................... 341/100; 377/47
[58] Field of Search .................... 341/100, 101; 377/47
[56]      References Cited
   U.S. PATENT DOCUMENTS
   4,703,495  10/1987  Bereznak ......................... 377/47 X
   5,020,082  5/1991  Takeda .............................. 377/47 X Primary Examiner—Sharon D. Logan
Attorney, Agent, or Firm—Whitham & Marhoefer

[57] ABSTRACT

A serial-parallel converting circuit comprises a four-stage shift register circuit receiving a serial data so as to shift the received serial data through the shift register in response to each clock signal, and an output register circuit coupled in parallel to respective stages of the shift register circuit so as to fetch the content of the shift register circuit in response to a frequency-divided clock supplied from a frequency dividing circuit. The frequency dividing circuit receives the clock signal through an inverter and is composed of only two D-type flipflops and one inverter. Each of the D-type flipflops has a clock input connected to receive the clock signal in common, and the D-type flipflops are connected in series to form a shifter register. A Q output of a second flipflop is connected through the inverter to a data input of a first flipflop, so that the Q output of the last flipflop generates the frequency-divided signal.

4 Claims, 3 Drawing Sheets

SERIAL-PARALLEL CONVERTING CIRCUIT

BACKGROUND OF THE INVENTION

1. Field Of The Invention

The present invention relates to a serial-parallel converting circuit, and more specifically to a serial-parallel converting circuit suitable for use in CMOS (complementary motel oxide semiconductor field effect transistor) LSI (large scaled integrated circuit).

2. Description of Related Art

A conventional serial-parallel converting circuit basically comprises a shift register circuit receiving a serial data and a clock signal so as to shift the received serial data through the shift register in response to each clock signal, and an output register circuit coupled in parallel to respective stages of the shift register circuit so as to fetch the content of the shift register circuit in response to a frequency-divided clock supplied from a frequency dividing circuit. Ordinary, the frequency dividing circuit receives the clock signal, and supplies the frequency-divided clock through a buffer to the output register circuit.

In the above mentioned serial-parallel converting circuit, the operation speed is limited by a maximum operation speed of the frequency dividing circuit. In this connection, the buffer supplying the frequency-divided clock to the output register circuit gives some delay. However, this delay can be made ignorable, by making a transfer delay from the shift register circuit to the output register circuit, consistent with the delay of the buffer. However, since the frequency dividing circuit is a counter constituted of a sequential circuit having a feedback loop, the operation speed cannot be equivalently increased by a method similar to the above mentioned matching of the delay time.

In addition, the feedback loop of the frequency dividing circuit includes therein a multi-input logic gate such as an exclusive-NOR gate. In the case that the serial-parallel converting circuit is formed in accordance with a CMOS LSI technology, the delay time of the exclusive-NOR gate substantially determines or dominates the delay time of the frequency dividing circuit.

Furthermore, if a parallel development number, namely, the number of parallel outputs is increased, the frequency dividing circuit becomes complicated in construction, and the maximum operation speed of the frequency dividing circuit is lowered.

SUMMARY OF THE INVENTION

Accordingly, it is an object of the present invention to provide a serial-parallel converting circuit which has overcome the above mentioned defect of the conventional one.

Another object of the present invention is to provide a serial-parallel converting circuit including a frequency dividing circuit having no multi-input logic gate which is a cause of a substantial delay in the frequency dividing circuit.

The above and other objects of the present invention are achieved in accordance with the present invention by a serial-parallel converting circuit comprising a shift register circuit receiving a serial data and a clock signal so as to shift the received serial data through the shift register in response to each clock signal, a frequency dividing circuit receiving the clock signal for generating a frequency-dividing clock, and an output register circuit coupled in parallel to respective stages of the shift register circuit and receiving the frequency-divided clock so as to fetch the content of the shift register circuit in response to the frequency-divided clock, the frequency dividing circuit being composed of only two kinds of functional circuit including a plurality of D-type flipflops and one inverter, each of the D-type flipflops having a clock input connected to receive the clock signal in common, the D-type flipflops being connected in series to form a shifter register, a Q output of a last flipflop is connected through the inverter to a data input of a first flipflop, the Q output of the last flipflop generating the frequency-divided signal.

The above and other objects, features and advantages of the present invention will be apparent from the following description of preferred embodiments of the invention with reference to the accompanying drawings.

DESCRIPTION OF THE PREFERRED EMBODIMENTS

Figure 1:
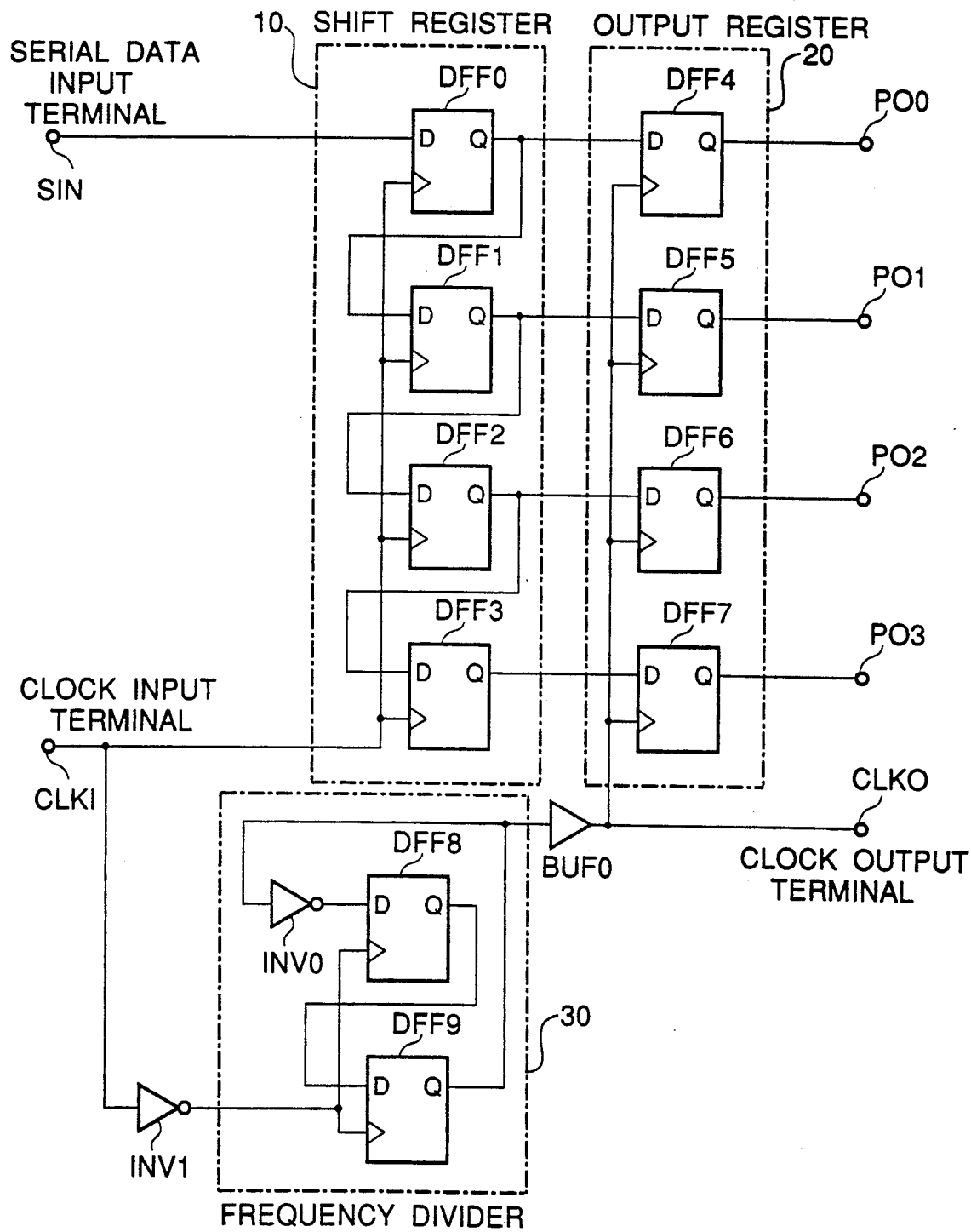
FIG. 1 is a block diagram of an embodiment of the serial-parallel converting circuit in accordance with the present invention.

Referring to FIG. 1, there is shown a block diagram of an embodiment of the serial-parallel converting circuit in accordance with the present invention.

The shown embodiment is configured to convert a serial data into a four-bit parallel data.

A serial data inputted to a serial data input terminal SIN is inputted to a shift register circuit 10 including four D-type flipflops DFF0 to DFF3 connected in series in the form of a shift register. Specifically, the serial data is supplied to a data input D of the first flipflop DFF0, and an output Q of the first to third flipflops DFF0 to DFF2 are connected to an input D of the second to fourth flipflops DFF1 to DFF3, respectively. The output Q of the flipflops DFF0 to DFF3 are connected to a data input D of four D-type flipflops DFF4 to DFF7 of an output register circuit 20, respectively, so that a serial data is developed into a four-bit parallel data. An output Q of the flipflops DFF4 to DFF7 are connected to four parallel output terminals PO0 to PO3, respectively.

The flipflops DFF0 to DFF3 of the register circuit 10 are driven by a clock signal supplied through a clock input terminal CLKI, and the flipflops DFF4 to DFF7 of the output register circuit 20 are driven by a ¼ divided clock supplied through a non-inverting driving buffer BUF0 from a frequency dividing circuit 30, which receives the clock signal through an inverter INV1.

The frequency dividing circuit 30 includes two D-type flipflops DFF8 and DFF9 receiving at their clock input the clock signal inverted by the inverter INV1. An output Q of the flipflop DFF8 is connected to a data input of the flipflop DFF9, in order to realize a delay of two bits at an output Q of the flipflop DFF9. The output Q of the flipflop DFF9 is connected back to a data input of the flipflop DFF8 through an inverter INV0.

With this arrangement, the ¼ divided clock can be obtained at the output Q of the flipflop DFF9. The output Q of the flipflop DFF9 is connected through the non-inverting driving buffer BUF0 to respective clock inputs of the flipflops DFF4 to DFF7 of the output register circuit 20, and also to a clock output terminal CLKO.

The above mentioned frequency-dividing circuit 30 includes only the inverter INV0 between the two D-type flipflops DFF8 and DFF9. Therefore, the frequency-dividing circuit 30 can have an operation speed near to a toggle frequency of each flipflop. For example, according to a CMOS process of the 0.8 μm rule, it was confirmed that the operation speed of 600 MHz or more can be realized.

Figure 2:
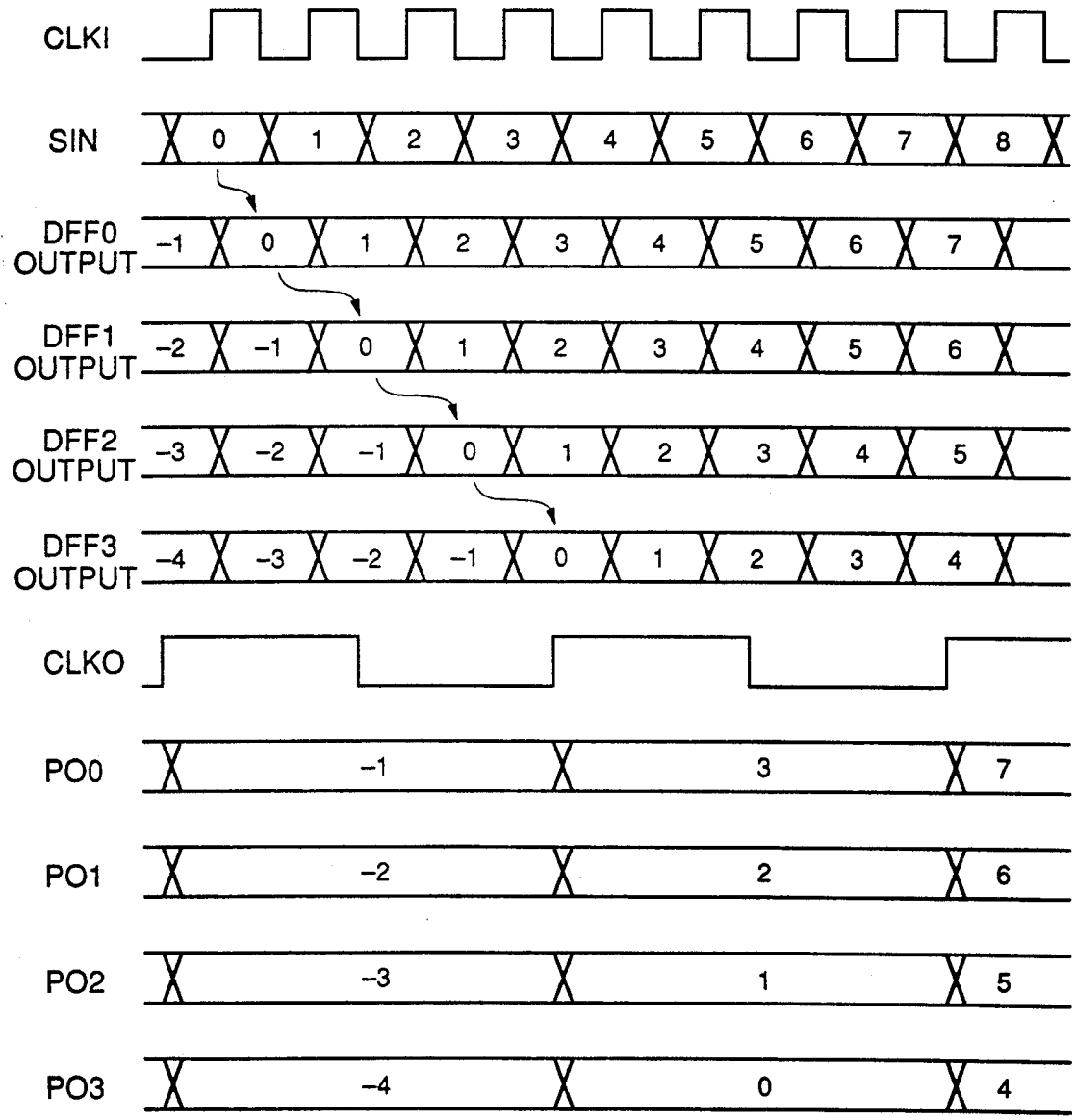
FIG. 2 is a timing chart illustrating the operation of the serial-parallel converting circuit shown in FIG. 1.

Referring to FIG. 2, an operation timing of the serial-parallel converting circuit shown in FIG. 1 is illustrated.

A train of serial data bits ("0", "1", "2", . . . ) are sequentially inputted to the shift register circuit 10 and shifted bit by bit through the flipflops DFF0 to DFF3 of the shift register circuit 10, in response to a rising edge of each clock signal supplied through the clock input terminal CLKI. The contents of these flipflops DFF0 to DFF3 are fetched to the flipflops DFF4 to DFF7 of the output register circuit 20, at a one-of-four-bits rate, namely, in response to a rising edge of each frequency-divided clock. Thus, four-bit parallel data is outputted from the parallel data output terminals PO0 to PO3.

Figure 3:
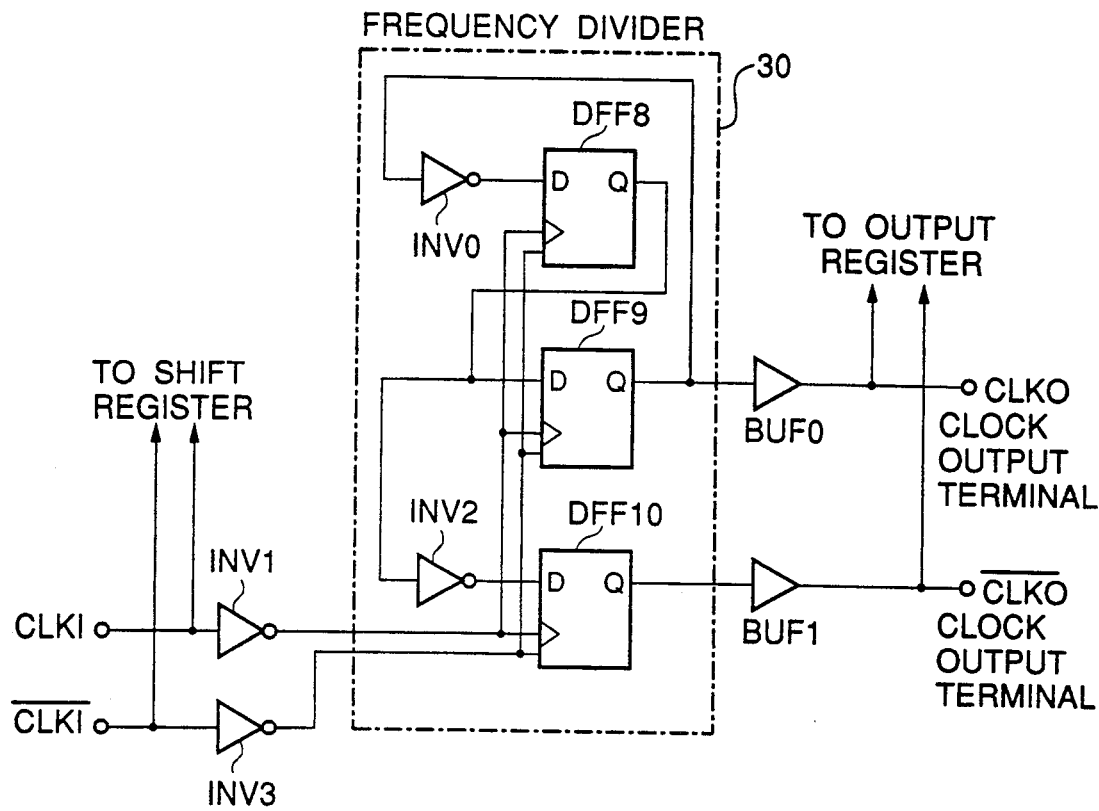
FIG. 3 is a logic circuit diagram of another example of the frequency dividing circuit.

Referring to FIG. 3, there is shown an example of the frequency dividing circuit 30 in the serial-parallel converting circuit composed of D-type flipflops each driven by a difference clock signal, namely, a pair of clock signals complementary to each other. The D-type flipflop driven by a difference clock signal can operate at a speed higher than the D-type flipflop driven by a single phase clock signal as shown in FIG. 1. In the case of speeding up the circuit shown in FIG. 1, it is necessary to make the skew of the ¼ divided clock as small as possible. For this purpose, the D-type flipflop driven by a difference clock signal is effective.

The frequency dividing circuit 30 shown in FIG. 3 includes, in addition to a loop composed of the D-type flipflops DFF8 and DFF9 and the inverter INV0 for generation of the ¼ divided clock, an inverter INV2 having an input connected to the output Q of the flipflop DFF8 and a D-type flipflop DFF10 having an input D connected to an output of the inverter INV2. A pair of clocks CLK1 and CLKI are supplied through the inverter INV1 and INV3 to a non-inverting clock input and an inverting clock input of each of the flipflops DFF8 to DFF10 (and also the flipflops DFF0 and DFF3 of the shift register circuit 10 not shown in FIG. 3). With this arrangement, a non-inverted ¼ divided clock CLKO and an inverted ¼ divided clock $\overline{\text{CLKO}}$ are timed and synchronized by the D-type flipflops DFF9 and DFF10, respectively. The non-inverted ¼ divided clock CLKO and the inverted ¼ divided clock $\overline{\text{CLKO}}$ are supplied through the non-inverting buffers BUF0 and BUF1 to a pair of clock output terminals and also a non-inverting clock input and an inverting clock input of each of the flipflops DFF4 to DFF7 of the output register circuit 20 not shown in FIG. 3.

Figure 4:
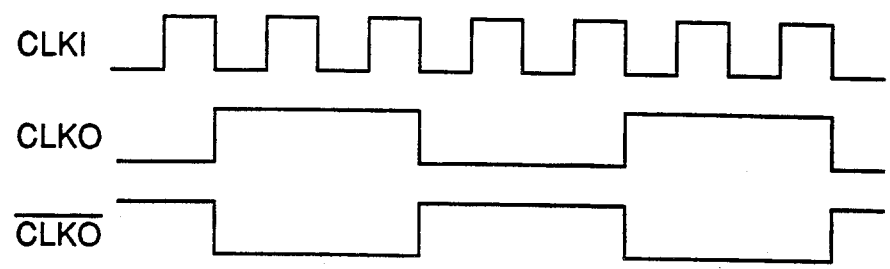
FIG. 4 a timing chart illustrating the operation of the frequency dividing circuit shown in FIG. 3.

FIG. 4 illustrates a timing chart of the non-inverted clock signal CLKI, the non-inverted ¼ divided clock CLKO and the inverted ¼ divided clock $\overline{\text{CLKO}}$.

In this example, since the non-inverted ¼ divided clock CLKO and the inverted ¼ divided clock $\overline{\text{CLKO}}$ are supplied to the output register circuit by causing the outputs of the flipflops DFF9 and DFF10 to be outputted directly through the non-inverting driving buffers BUF0 and BUF1, the skew can be make smaller than the case in which the inverted ¼ divided clock $\overline{\text{CLKO}}$ is obtained by inverting the output of the flipflop DFF9 by an inverter.

In the above mentioned embodiment, the serial data is converted into a four-bit parallel data. However, according to the present invention, a frequency dividing circuit for frequency-dividing a clock signal by an even number, for example, into 1/6, ⅛, etc., can be easily realized by simply increasing the number of the flipflops in the frequency dividing circuit. In this case, a critical path within the frequency dividing circuit is generated at a location where an inverter is inserted, but the critical path is independent upon the parallel development number, namely, the number of parallel outputs. In other words, the number of parallel outputs is not limited by the speed of the frequency dividing circuit.

The invention has thus been shown and described with reference to the specific embodiments. However, it should be noted that the present invention is in no way limited to the details of the illustrated structures but changes and modifications may be made within the scope of the appended claims.

I claim:

1. A serial-parallel converting circuit comprising:
    a shift register circuit receiving a serial data and first and second complementary clock signals so as to shift the received serial data through the shift register in response to said clock signals,
    an output register circuit coupled in parallel to respective stages of the shift register circuit and receiving first and second complementary frequency-divided clock signals so as to fetch the content of the shift register circuit in response to the frequency-divided clock signals, and
    a frequency dividing circuit receiving the first and second complementary clock signals for generating said first and second complementary frequency-divided clock signals, said frequency dividing circuit being composed of only a plurality of D-type flipflops, one additional D-type flipflop and first and second inverters, the plurality of D-type flipflops and the additional D-type flipflop having first and second clock inputs for receiving the first and second complementary clock signals, the plurality of D-type flipflops being connected in series to form a shift register circuit in such a manner that a Q output of a last flipflop is connected through the first inverter to a data input of a first flipflop, and the second inverter having an input connected to the data input of the last flipflop and an output connected to a data input of the additional D-type flipflop, respective Q outputs of the last flipflop and the additional D-type flipflop generating said first and second complementary frequency-divided signals.

2. A serial-parallel converting circuit claimed in claim 1 wherein the frequency dividing circuit is connected to receive the first and second complementary clock signals through third and fourth inverters, respectively, so that a clock input of each of the D-type flipflops is connected to receive the corresponding clock signal inverted by one of said third or fourth inverters.

3. A serial-parallel converting circuit claimed in claim 2 wherein the first and second complementary frequency-divided clock signals are supplied through first and second non-inverting buffer circuits to the output register circuit.

4. A serial-parallel converting circuit claimed in claim 3 wherein the shift register circuit includes "n" D-type flipflops ("n" is an even number) connected in series to form a shifter register circuit in such a manner that all of the "n" D-type flipflops receives the first and second complementary clock signals in common at their clock inputs, and a first flipflop has a data input connected to receive the serial data and a "i"th flipflop ($1 \leq i \leq n-1$) has a Q output connected to a data input of a "i+1"th flipflop, and the output register circuit includes "n" D-type flipflops each having its data input connected to a Q output of a corresponding one of the "n" D-type flipflops of the shift register circuit, all of the "n" D-type flipflops of the output register circuit receiving the first and second complementary frequency-divided clock signals at their clock inputs.

* * * * *